US012716915B2

(12) United States Patent
Shuto

(10) Patent No.: US 12,716,915 B2
(45) Date of Patent: Aug. 25, 2026

(54) PROBE

(71) Applicant: Kabushiki Kaisha Nihon Micronics, Tokyo (JP)

(72) Inventor: Akihiro Shuto, Oita (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 201 days.

(21) Appl. No.: 18/729,880

(22) PCT Filed: Dec. 6, 2022

(86) PCT No.: PCT/JP2022/044964
§ 371 (c)(1),
(2) Date: Jul. 17, 2024

(87) PCT Pub. No.: WO2023/139953
PCT Pub. Date: Jul. 27, 2023

(65) Prior Publication Data

US 2025/0138049 A1 May 1, 2025

(30) Foreign Application Priority Data

Jan. 18, 2022 (JP) ................................ 2022-005551

(51) Int. Cl.
*G01R 1/067* (2006.01)

(52) U.S. Cl.
CPC ..... *G01R 1/06722* (2013.01); *G01R 1/06733* (2013.01); *G01R 1/06755* (2013.01)

(58) Field of Classification Search
CPC ............ G01R 1/06722; G01R 1/06733; G01R 1/06755; G01R 1/06716; G01R 1/06738; G01R 1/067
See application file for complete search history.

(56) References Cited

U.S. PATENT DOCUMENTS

| | | | |
|---|---|---|---|
| 2004/0121627 | A1 | 6/2004 | Grube et al. |
| 2015/0015289 | A1 | 1/2015 | Eldridge |

FOREIGN PATENT DOCUMENTS

| | | | |
|---|---|---|---|
| JP | H05226043 | A | 9/1993 |
| JP | 2006511804 | A | 4/2006 |
| JP | 2010071760 | A | 4/2010 |
| JP | 2010281583 | A | 12/2010 |
| JP | 2014510283 | A | 4/2014 |
| JP | 2016524169 | A | 8/2016 |
| JP | 2018091870 | A | 6/2018 |
| JP | 2018515752 | A | 6/2018 |

(Continued)

OTHER PUBLICATIONS

Machine translation of JP-2022-094594 (Year: 2022).*

*Primary Examiner* — G.M. A Hyder
(74) *Attorney, Agent, or Firm* — Ingrassia Fisher & Lorenz, LLP

(57) ABSTRACT

The probe has a main body and a spring portion having an electrical resistivity and elastic modulus greater than the main body, and the main body and the spring portion are connected in parallel. The main body has a structure in which a tip part, an elastically deformable barrel, and a base end part are connected in this order. The spring portion has a structure in which a first joint joined to the tip part, an elastic deformation part, and a second joint joined to the base end part are connected in this order.

8 Claims, 5 Drawing Sheets

(56) References Cited

FOREIGN PATENT DOCUMENTS

| | | | | |
|---|---|---|---|---|
| JP | 2022094594 | A | * | 6/2022 |
| KR | 101799309 | B1 | | 12/2017 |
| KR | 20180095315 | A | | 8/2018 |

* cited by examiner

PROBE

TECHNICAL FIELD

The present invention relates to a probe used for measuring the characteristics of an inspected object.

BACKGROUND

A probe is used for measuring the characteristics of an integrated circuit, and the like. During inspection using the probe, one end of the probe is brought into contact with an inspected object, and the other end of the probe is brought into contact with a terminal, hereinafter referred to as "land", arranged on a circuit board, and the like. The land is electrically connected to an inspection device such as a tester.

In the inspection of the inspected object, a probe having an elastically deformed spring portion between one end and the other end is used in order to ensure an electrical connection between the probe and the inspected object and the land. When one end of the probe having the spring portion is brought into contact with the inspected object and the other end is brought into contact with the land, the elastic deformation occurs in the spring portion. The force, hereinafter referred to as "load", due to the elastic deformation of the spring portion stabilizes the contact between the probe and the inspected object and the land.

CITATION LIST

Patent Literature

Patent Literature 1: Japanese Patent Application Publication No. 2010-281583

SUMMARY OF THE INVENTION

Problem to be Solved by the Invention

When an abnormality such as a short circuit of an internal circuit occurs in an inspected object, an excessive current, hereinafter also referred to as "overcurrent", flows through the probe in the inspection of the electrical characteristics of the inspected object. When the probe is heated due to Joule heat generated by the overcurrent, plastic deformation occurs in the probe or the probe is fused. When plastic deformation occurs in the probe, the load is lowered and the contact between the probe and the inspected object and the land cannot be stabilized.

In view of the above problem, it is an object of the present invention to provide a probe capable of preventing the lowering of the load due to the current flowing in the probe.

Means for Solving the Problem

According to an aspect of the present invention, provided is a probe having a main body and a spring portion having an electrical resistivity and an elastic modulus greater than the main body, in which the main body and the spring portion are connected in parallel. The main body has a structure in which a tip part, an elastically deformed barrel, and a base end part are connected in this order. The spring portion has a structure in which a first joint joined to the tip part, an elastic deformation part that is elastically deformed, and a second joint joined to the base end part are connected in this order.

Effect of the Invention

According to the present invention, it is possible to provide a probe capable of preventing the lowering of the load due to the current flowing in the probe.

DESCRIPTION OF EMBODIMENTS

Figure 1:
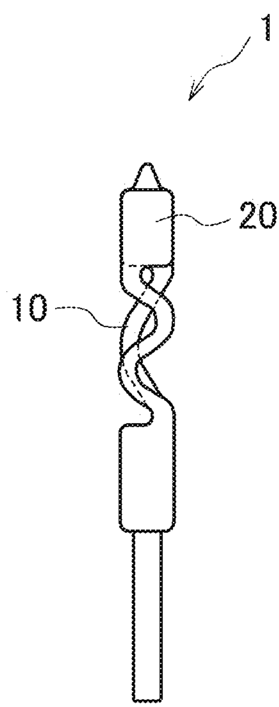
FIG. 1 is a schematic diagram showing a structure of a probe according to an embodiment.

Embodiments of the present invention will now be described with reference to the drawings. In the description of the following drawings, the same or similar portions are denoted by the same or similar reference numerals. However, the drawings are schematic, and the length and thickness ratio of each part are different from the actual ones. In addition, the drawings also include parts whose dimensional relationship and ratio are different from each other.

The probe 1 according to the embodiment of the present invention shown in FIG. 1 is used for inspecting the electrical characteristics of an inspected object. The probe 1 includes a main body 10 and a spring portion 20.

Figure 2:
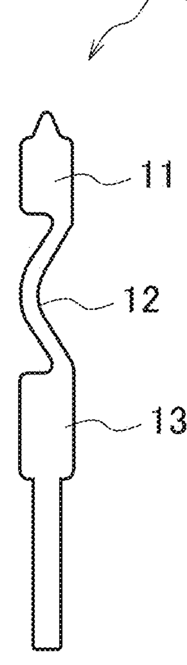
FIG. 2 is a schematic diagram showing a configuration of a main body of a probe according to an embodiment.

As shown in FIG. 2, the main body 10 of the probe 1 has a structure in which a tip part 11, a barrel 12 and a base end part 13 are connected in this order. One end of the tip part 11 is connected to the barrel 12, and the other end of the tip part 11 is protruded. A protruded tip of the tip part 11 is hereinafter also referred to as a "first end of the probe 1". One end of the base end part 13 is connected to the barrel 12, and the other end of the base end part 13 linearly expands. The tip of the linearly extending end of the base end part 13 is hereinafter also referred to as a "second end of the probe 1". The barrel 12 has a curved shape, and the barrel 12 is elastically deformed when the probe 1 comes into contact with the inspected object during inspection of the inspected object.

Figure 3:
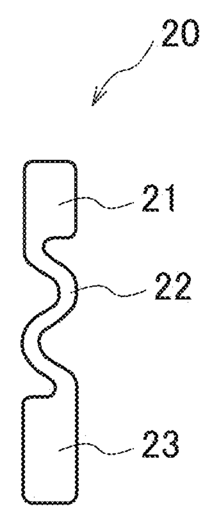
FIG. 3 is a schematic diagram showing a structure of a spring portion of a probe according to an embodiment.

As shown in FIG. 3, the spring portion 20 of the probe 1 has a structure in which a first joint 21, an elastic deformation part 22, and a second joint 23 are connected in this order. The elastic deformation part 22 is elastically deformed when the probe 1 comes into contact with the inspected object during inspection of the inspected object.

When the main body 10 of the probe 1 comes into contact with the inspected object, both the barrel 12 and the elastic deformation part 22 are elastically deformed, but the shapes of the barrel 12 and the elastic deformation part 22 may be different. For example, the shape and material of the barrel 12 and the elastic deformation part 22 may be different. By changing the shape of the barrel 12 and the shape of the elastic deformation part 22, the elasticity of the barrel 12 and the elastic deformation part 22 can be equivalent even if materials of the barrel 12 and the elastic deformation part 22 are different. The equivalent elasticity of the barrel 12 and the elastic deformation part 22 allows the posture of the end of the probe 1 in contact with the inspected object to be stabilized. The shape of the barrel 12 and the elastic deformation part 22 may be set in accordance with the stress generated in the probe 1 when the probe 1 is in contact with the inspected object, the displacement (scrub amount) of the tip of the probe 1 in the direction parallel to the surface of the inspected object during the contact, and the materials of the main body 10 and the spring portion 20.

The barrel 12 may not be elastic. That is, the elasticity of the probe 1 when the probe 1 comes into contact with the inspected object may be exerted only at the elastic deformation part 22. When only the elastic deformation part 22 is elastically deformed during inspection, the elasticity of the probe 1 does not decrease even if the barrel 12 wear out due to, for example, Joule heat due to the current flowing in the main body 10. As a result, the probe 1 can be used for the inspection of the inspected object in the long term. In addition, the elastic modulus of the elastic deformation part 22 may be larger than the elastic modulus of the barrel 12. When the elastic modulus of the elastic deformation part 22 is larger than that of the barrel 12, the load due to the elastic deformation of the probe 1 during the inspection mainly occurs at the spring portion 20. Therefore, the influence on the elasticity of the whole probe 1 due to the wear-out generated in the barrel 12 is reduced.

Figure 4:
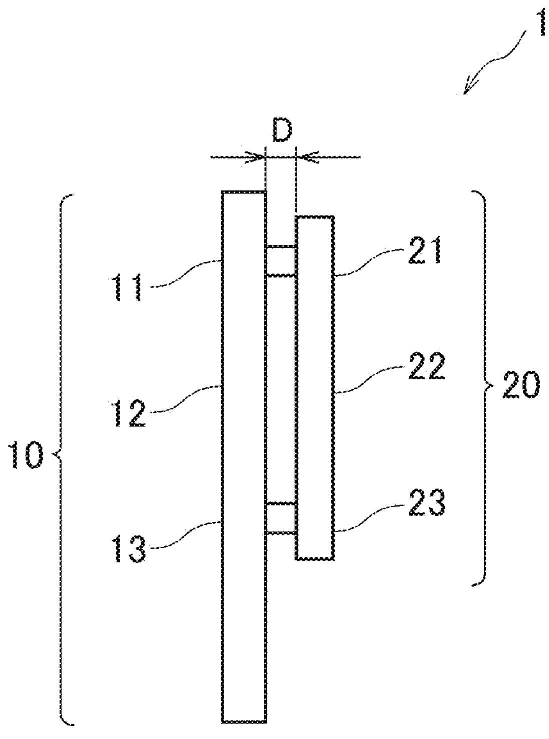
FIG. 4 is a schematic diagram showing a structure of a connection of a main body and a spring portion of a probe according to an embodiment.

As shown in FIG. 4, the first joint 21 of the spring portion 20 is joined to the tip part 11 of the main body 10. The second joint 23 of the spring portion 20 is joined to the base end part 13 of the main body 10. In FIG. 4, the distance D between the main body 10 and the spring portion 20 is clearly indicated in order to make it easier to understand joined parts between the main body 10 and the spring portion 20. For the joint of the main body 10 and the spring portion 20, a method such as diffusion bonding, resistance welding, or brazing may be used. As shown in FIGS. 1 and 4, the main body 10 and the spring portion 20 are connected in parallel.

In the probe 1, the electrical resistivity and elastic modulus of the spring portion 20 are larger than those of the main body 10. That is, the current flows more easily to the main body 10 than to the spring portion 20. The elastic modulus of the elastic deformation portion 22 of the spring portion 20 is larger than that of the barrel 12 of the main body 10.

In the inspection of an inspected object, a current flows between the inspected object and an inspection device such as a tester through a probe 1. For example, the first end of the probe 1 (the tip of the tip part 11) contacts the land, and the second end of the probe 1 (the tip of the base end part 13) contacts an electrode terminal of the inspected object. As shown in FIGS. 1 and 4, respective ends of the tip part 11 and the base end part 13 of the main body 10 protrude in an axial direction relative to ends of the spring portion 20. The "axial direction" is a direction from the tip part 11 of the probe 1 toward the base end part 13. The ends of the tip part 11 and the base end part 13 protrude relative to the ends of the spring portion 20, so that the spring portion 20 does not come into contact with the electrode terminal of the inspected object and the land. When the tip of the spring portion 20 is arranged not to come into contact with the inspected object and the land, respective ends of the tip part 11 and the base end part 13 may not protrude in the axial direction relative to the ends of the spring portion 20.

The probe 1, in which the main body 10 has a barrel 12 and the spring portion 20 has an elastic deformation part 22, is expandable and contractible in the axial direction. The expanding and contracting directions of the barrel 12 and the elastic deformation part 22 are in the axial direction of the probe 1. During the measurement of the inspected object, the probe 1 expands and contracts in the axial direction. That is, the probe 1 contracts in the axial direction when the probe 1 comes into contact with the inspected object, and the probe 1 expands in the axial direction when the probe 1 leaves the inspected object. The contact between the probe 1 and the inspected object and the contact between the probe 1 and the land can be stabilized by the load generated by the contraction of the probe 1 during the measurement of the inspected object.

For example, the second end of the probe 1 is brought into contact with the inspected object while the first end of the probe 1 is brought into contact with the land. At this time, the barrel 12 of the main body 10 and the elastic deformation part 22 of the spring portion 20 are contracted. When the second end of the probe 1 is separated from the inspected object, the barrel 12 and the clastic deformation part 22 are expanded.

In order to expand and contract the probe 1 in the axial direction, the barrel 12 of the main body 10 and the elastic deformation part 22 of the spring portion 20 are formed to be expandable and contractible in the axial direction. In the probe 1 shown in FIG. 1, the barrel 12 and the elastic deformation part 22 have a curved shape. The expandable and contractible structure used for the barrel 12 and the elastic deformation part 22 is not limited to a curved shape. The barrel 12 and the elastic deformation portion 22 may be differently formed to be expandable and contractible in the axial direction of the probe 1.

The distance between the main body 10 and the spring portion 20 shown as the distance D in FIG. 4 is preferably set so that the main body 10 and the spring portion 20 do not come into contact with each other during expansion or contraction of the probe 1. By setting the distance D so that the main body 10 and the spring portion 20 do not come into contact with each other, the damage to the probe 1 caused by the contact between the main body 10 and the spring portion 20 during the expansion or contraction of the probe 1 can be reduced. On the other hand, by narrowing the distance D, the probe 1 can be miniaturized. Furthermore, by narrowing the distance D, the distance between adjacent probes 1 can be narrowed to accommodate the narrowing pitch of the electrode terminal of the inspected object.

In the probe 1, the electrical resistivity of the main body 10 is lower than the spring portion 20, so that the current flowing through the probe 1 during the inspection of the inspected object flows mainly to the main body 10. In the probe 1, the elastic modulus of the main body 10 is lower than the elastic modulus of the spring portion 20, so that the load due to the elastic deformation of the probe 1 during the inspection of the inspected object mainly is generated by the spring portion 20.

The main path of the current flowing through the probe 1 is the main body 10, so that the current flowing through the spring portion 20 can be reduced. Therefore, the generation of Joule heat of the spring portion 20 by the current flowing through the probe 1 during the inspection of the inspected object can be suppressed. Alternatively, all current flows through the main body 10 and no current flows through the spring portion 20, so that Joule heat of the spring portion 20 cannot be generated.

In the probe 1, the main path of the current flowing through the probe 1 is the main body 10, so that plastic deformation of the spring portion 20 due to the current flowing through the probe 1 can be prevented even when an overcurrent flows through the probe 1. By preventing plastic deformation of the spring portion 20, it is possible to increase a current value, hereinafter also referred to as "allowable current value", of the probe 1, below which the load required for measuring the inspected object cannot be obtained. Further, the probe 1 can prevent the probe 1 from being fused by the overcurrent flowing through the probe 1.

For example, gold (Au), silver (Ag), copper (Cu), or an alloy containing one or more of these metals may be used as the material of the main body 10. Nickel (Ni) alloy, titanium (Ti) alloy, stainless steel (SUS), or a Ni-base heat-resistant alloy may be used as the material of the spring portion 20. As the material of the spring portion 20, it is possible to use a high heat-resistant material which was previously unsuitable as a probe material due to the large electrical resistivity.

Figure 5:
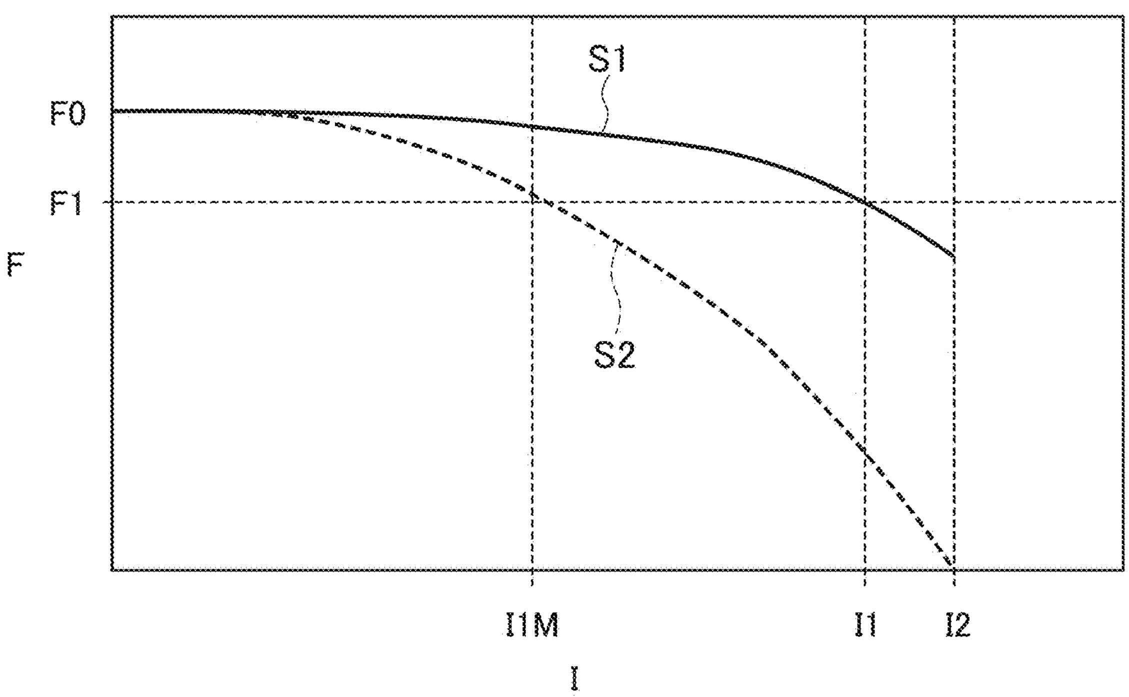
FIG. 5 is a graph showing the relationship between the current flowing through a probe and a load.
Figure 6:
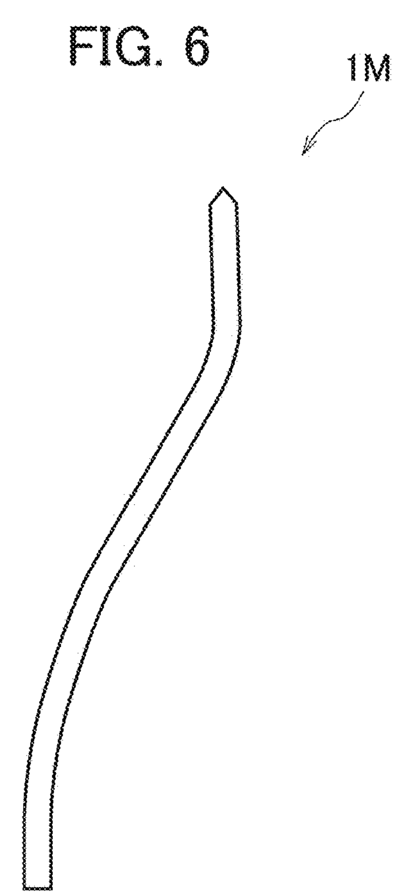
FIG. 6 is a schematic diagram showing the structure of a probe of a comparative example.

FIG. 5 shows the relationship between the current I flowing through the probe and the load F. The solid line S1 shown in FIG. 5 indicates the relationship between the current I flowing through the probe 1 and the load F. The dashed line S2 shown in FIG. 5 indicates the relationship between the current I flowing through the comparative probe 1M of the comparative example shown in FIG. 6 and the load F. In the comparative probe 1M, the current flows through the curved part that functions as a spring portion for generating the load.

In FIG. 5, an initial load F0 of the probe 1 and the comparative probe 1M is a load generated in an unused probe in which no current is flowing. A lower load F1 is a lower limit of the load required for stable contact of the probe with the inspected object and the land. That is, for the dashed line S2, the current I1M at which the load F decays from the initial load F0 to the lower load F1 is the allowable current value of the comparison probe 1M. On the other hand, for the solid line S1, the current I1 at which the load F decays from the initial load F0 to the lower load F1 is the allowable current value of the probe 1. The allowable current value is determined by the material, shape, and position and size of the curved portion of the probe. The fusing current I2 is the current value at which the probe is fused by Joule heat due to the current I.

As shown in FIG. 5, the curved portion of the comparison probe 1M is the path of the current I, so that the load is likely to be lowered due to plastic deformation. Therefore, as shown in dashed line S2 in FIG. 5, the load F falls below the lower limit load F1 at around 50% of the fusing current I2. Therefore, it is necessary to take measures such as lowering the maximum value of the current flowing through the comparison probe 1M. If the maximum value of the current flowing through the probe is lowered, the contents of the inspection of the inspected object may be restricted.

On the other hand, in the probe 1, by reducing or eliminating the current flowing through the spring portion 20, it is possible to suppress the lowering of the load due to plastic deformation of the elastic deformation part 22. Therefore, as shown by the solid line S1 in FIG. 5, the allowable current value of the probe 1 increases relative to the comparison probe 1M.

As described above, in the probe 1 according to the embodiment, a current mainly flows through the main body 10, and the spring portion 20 mainly generates a load due to elastic deformation. Therefore, the lowering of the load due to the current flowing through the probe 1 is suppressed. As a result, the probe 1 can stabilize the contact between the probe 1 and the inspected object and the land.

First Modified Example

Figure 7:
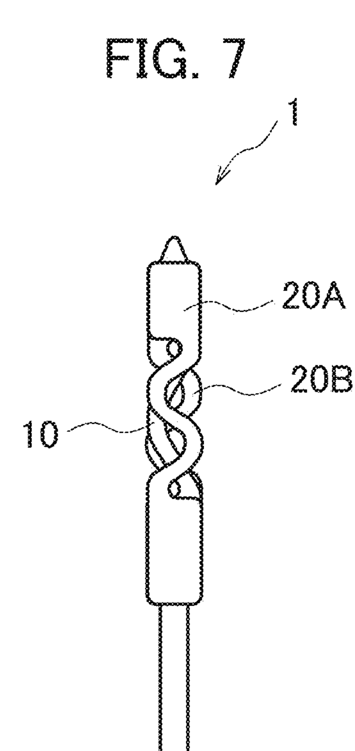
FIG. 7 is a schematic diagram showing the structure of a probe according to a first modified example of the embodiment.
Figure 8:
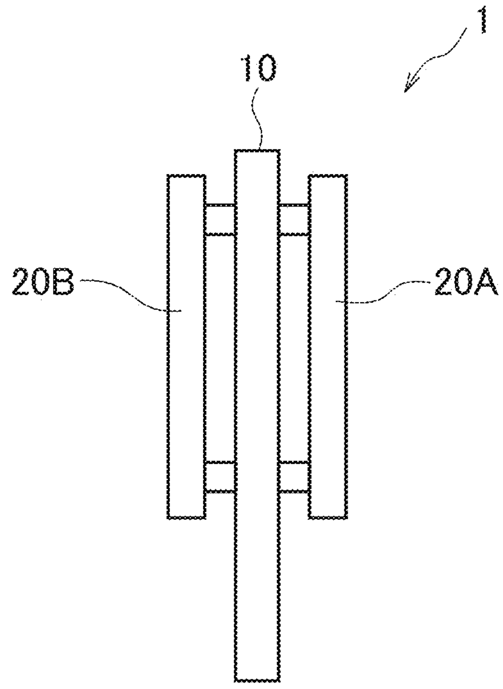
FIG. 8 is a schematic diagram showing a structure of connection of the main body and the spring portion of the probe according to the first modified example of the embodiment.

In the probe 1, each of a plurality of spring portions 20 may be connected in parallel with the main body 10. For example, in the probe 1 according to a first modification shown in FIGS. 7 to 8, a first spring portion 20A and a second spring portion 20B are connected in parallel with the main body 10. As shown in FIG. 8, the first spring portion 20A and the second spring portion 20B are joined to the main body 10 across the main body 10.

In the probe 1 having a plurality of spring portions 20, the lowering of the load due to the current flowing in the probe 1 can be further suppressed. By suppressing the lowering of the load, the allowable current value of the probe 1 can be increased. Moreover, by suppressing the lowering of the load, the operating environment temperature of the probe 1 can be increased. Furthermore, the design degree of freedom for the load is increased, so that the probe 1 can also be used for inspection requiring a large load. For example, a large load is required for inspection of an inspected object whose electrode material is a solder bump. The probe 1 having a plurality of spring portions 20 can be used for inspection requiring a large load.

Second Modified Example

Figure 9:
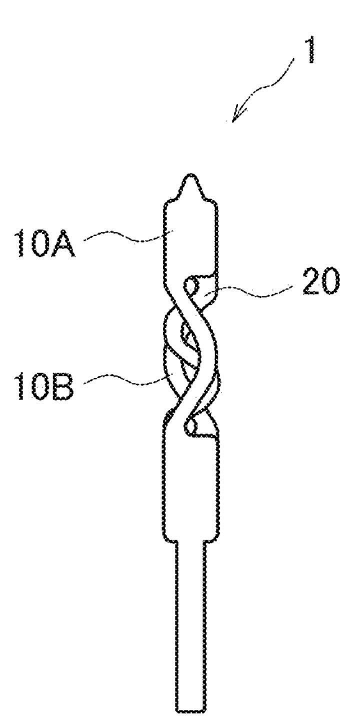
FIG. 9 is a schematic diagram showing a structure of a probe according to a second modified example of the embodiment.
Figure 10:
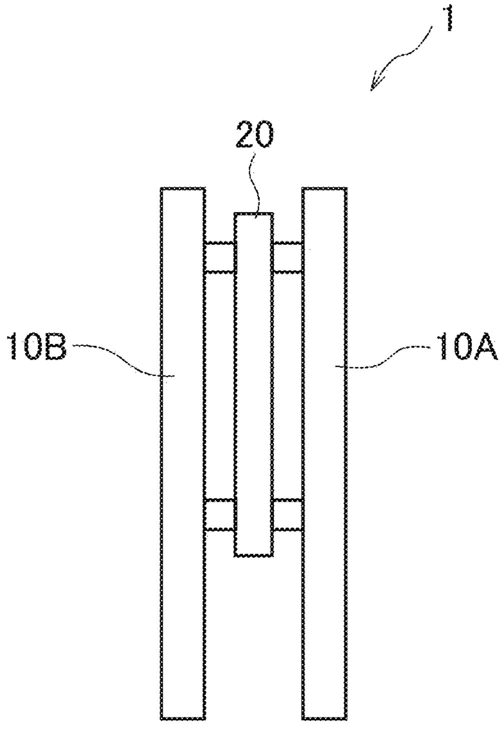
FIG. 10 is a schematic diagram showing a structure of connection of the main body and the spring portion of the probe according to the second modification of the embodiment.

In the probe 1, each of a plurality of main bodies 10 may be connected in parallel with the spring portion 20. For example, in the probe 1 according to a second modified example shown in FIGS. 9 to 10, a first main body 10A and a second main body 10B are connected in parallel with the spring portion 20. As shown in FIG. 10, the first main body 10A and the second main body 10B are joined to the spring portion 20 across the spring portion 20.

The plurality of main bodies 10, each connected in parallel with the spring portion 20 may be electrically insulated from each other. The probe 1 shown in FIG. 9 may be used as a Kelvin probe, for example. Alternatively, the allowable current value of the probe 1 may be increased by bringing the plurality of main bodies 10 into contact with the same electrode terminal. The plurality of main bodies 10 need not be insulated from each other when they are contacted with the same electrode terminal.

OTHER EMBODIMENTS

Although the present invention has been described according to the embodiment as described above, it should not be understood that the description and drawings which form part of this disclosure limit the invention. The disclosure will reveal to those skilled in the art a variety of alternative embodiments, examples and operational techniques.

For example, although the probe 1 having one main body 10 and a plurality of spring portions 20 or having one spring portion 20 and a plurality of main body 10 have been described above, the probe 1 may have a plurality of main bodies 10 and a plurality of spring portions 20.

As described above, the present invention may of course include various embodiments not described herein. Accordingly, the technical scope of the present invention is defined only by the matters specified in the invention that are within the scope of claims considered reasonable from the above description.

REFERENCE SIGNS LIST

1 Probe
10 Main body
11 Tip part
12 Barrel
13 Base end part
20 Spring portion
21 First joint
22 Elastic deformation part
23 Second joint

What is claimed is:

1. A probe comprising:

a main body having a structure in which a tip part, a barrel, and a base end part are connected in this order; and a spring portion having a structure in which a first joint joined to the tip part, an elastic deformation part that is elastically deformed, and a second joint joined to the base end part are connected in this order, and having an electrical resistivity and an elastic modulus greater than the main body;

wherein the main body and the spring portion are connected in parallel.

2. The probe according to claim 1, wherein respective ends of the tip part and the base end part protrude in an axial direction relative to ends of the spring portion.

3. The probe according to claim 1, wherein the elastic deformation part have a curved shape.

4. The probe according to claim 1, comprising a plurality of the spring portions, each connected in parallel with the main body.

5. The probe according to claim 1, comprising a plurality of the main bodies, each connected in parallel with the spring portion.

6. The probe according to claim 5, wherein the plurality of main bodies, each connected in parallel with the spring portion, are electrically insulated from each other.

7. The probe according to claim 1, the probe has the barrel which is elastically deformed, and the shape of the barrel is different from the shape of the elastic deformation part.

8. The probe according to claim 1, wherein the elastic deformation part is elastically deformed and the barrel is not elastically deformed when the main body comes into contact with an inspected object.

* * * * *